United States Patent [19]
Huang

[11] Patent Number: 6,087,260
[45] Date of Patent: Jul. 11, 2000

[54] METHOD OF MANUFACTURING BIT LINE

[75] Inventor: Hsiu-Wen Huang, Kaoshiung, Taiwan

[73] Assignee: United Semiconductor Corp., Hsinchu, Taiwan

[21] Appl. No.: 09/252,600

[22] Filed: Feb. 16, 1999

[30] Foreign Application Priority Data

Dec. 14, 1998 [TW] Taiwan .................................. 87120717

[51] Int. Cl.[7] ..................................................... H01L 21/20

[52] U.S. Cl. ........................................... 438/682; 438/649

[58] Field of Search ..................................... 438/257, 663, 438/648, 649, 682, 683

[56] References Cited

U.S. PATENT DOCUMENTS 5,795,827  8/1998  Liaw et al. ............................... 438/663

Primary Examiner—David Nelms
Assistant Examiner—D. Nhu
Attorney, Agent, or Firm—J.C. Patents; Jiawei Huang

[57] ABSTRACT

A method for manufacturing a bit line. A substrate having a dielectric layer on the substrate and a contact hole penetrating through the dielectric layer and exposing portions of the substrate is provided. A patterned conductive layer is formed on the dielectric layer and fills the contact hole. The surface of the patterned conductive layer is converted into an oxide layer. The oxide layer is removed. A silicide layer is formed on the patterned conductive layer.

19 Claims, 3 Drawing Sheets

METHOD OF MANUFACTURING BIT LINE

CROSS-REFERENCE TO RELATED APPLICATION

This application claims the priority benefit of Taiwan application Ser. No. 87120717, filed Dec. 14, 1998, the full disclosure of which is incorporated herein by reference.

BACKGROUND OF THE INVENTION

1. Field of the Invention

The present invention relates to a method of manufacturing a semiconductor device. More particularly, the present invention relates to a method of manufacturing a bit line.

2. Description of the Related Art

In the design of Ultra Large Scale Integration (ULSI) DRAM, the lithography and alignment controlling the contact are increasingly critical as the device size is gradually reduced. When the photolithography step is performed to define a node contact hole, the node contact hole must align with the source/drain region. The larger the node contact hole is, the less tolerance for the contact hole the source/drain region has. The lower tolerance of the source/drain for the node contact hole results in the decrease of the alignment accuracy. Accordingly, the node contact is easily electrically coupled to the bit line surrounding the node contact, and this causes device failure.

FIGS. 1A through 1C are schematic, cross-sectional views of the conventional process for manufacturing a bit line.

As shown in FIG. 1A, a dielectric layer 104 is formed on a substrate 100 having a field effective transistor (FET) 102 on the substrate 100. A contact hole 108 is formed in the dielectric layer 104 and exposes a source/drain region 106. A polysilicon layer 110 is formed on the dielectric layer 104 and fills the contact hole 108.

As shown in FIG. 1B, the polysilicon layer is patterned to form a bit line 112. At this point, the bit line 112 process is finished.

As shown in FIG. 1C, after the process of fabricating a bit line of DRAM is finished, a dielectric layer 114 is formed over the substrate 100. A node contact hole 116 is formed in the dielectric layer 114 and exposes the source/drain region 106. A capacitor 118 is formed to electrically couple to the source/drain region 106 through the node contact hole 116.

As the integration of the integrated circuit increases and the density of the device in a wafer correspondingly increases, the process for manufacturing the node contact hole 116 mentioned above has a problem with the inadequate alignment margin between the node contact hole 116 and the bit line 112. Conventionally, the problem of the inadequate alignment margin can be solved by decreasing the width of the bit line. However, the method of decreasing the width of the bit line is limited by the resolution of the photolithography. Moreover, since the resistance of the bit line increases as the width of the bit line is decreased, it adversely affects DRAM operating at high speeds.

SUMMARY OF THE INVENTION

It is therefore an objective of the invention to provide a method of manufacturing a bit line. In the invention, the size and the resistance of the bit line are greatly reduced, and the integration of the devices is increased.

To achieve these and other advantages and in accordance with the purpose of the invention, as embodied and broadly described herein, the invention provides a method of manufacturing a bit line. A substrate having a dielectric layer on the substrate and a contact hole exposing portions of the substrate and penetrating through the dielectric layer is provided. A patterned conductive layer is formed on the dielectric layer and filling the contact hole. The surface of the patterned conductive layer is converted into an oxide layer. The oxide layer is removed. A silicide layer is formed on the patterned conductive layer. The resistance of the silicide layer is much lower than that of the polysilicon typically used to form a bit line. Moreover, because the thickness of the silicide layer is thinner than the oxide layer, the size of the bit line is much smaller than that of the typical bit line. Therefore, the size of the bit line formed by the method according to the invention is decreased and the resistance of the bit line is greatly reduced. Furthermore, the integration of the devices is greatly increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
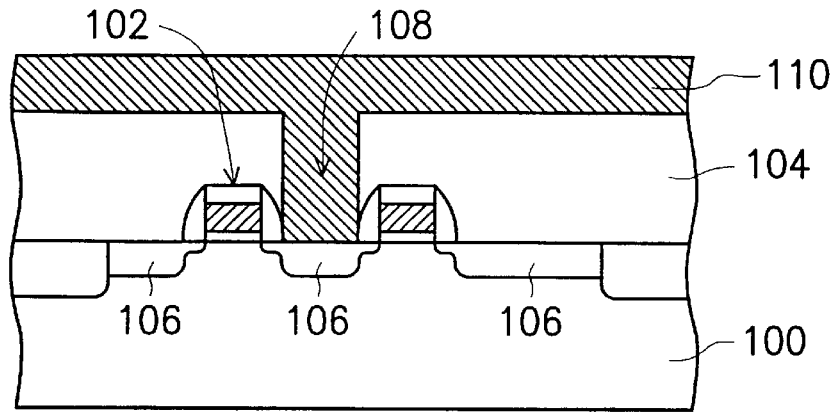
FIGS. 1A through 1C are schematic, cross-sectional views of the conventional process for manufacturing a bit line.
Figure 1B:
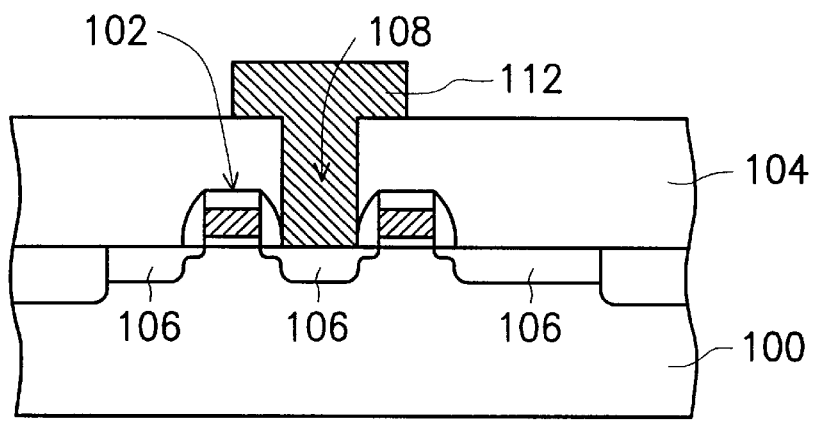
Figure 1C:
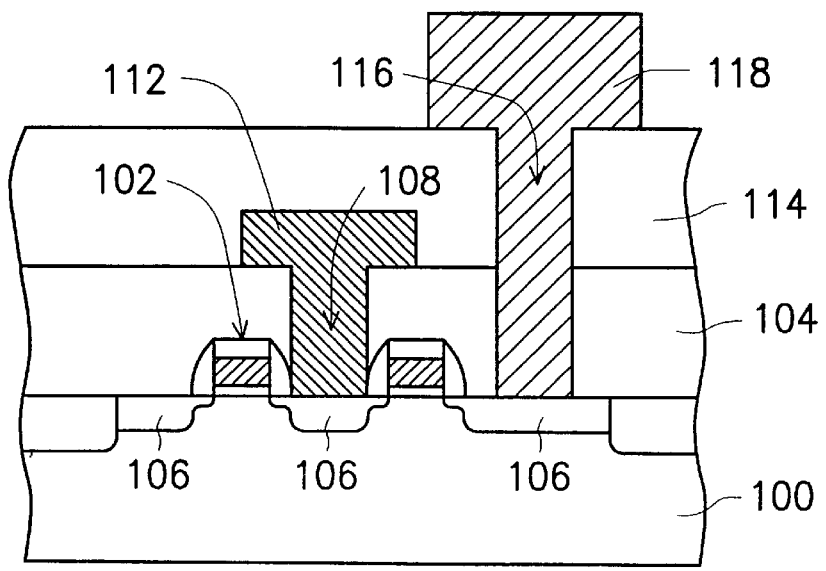

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic, cross-sectional views of the process for manufacturing a bit line in a preferred embodiment according to the invention.

Figure 2A:
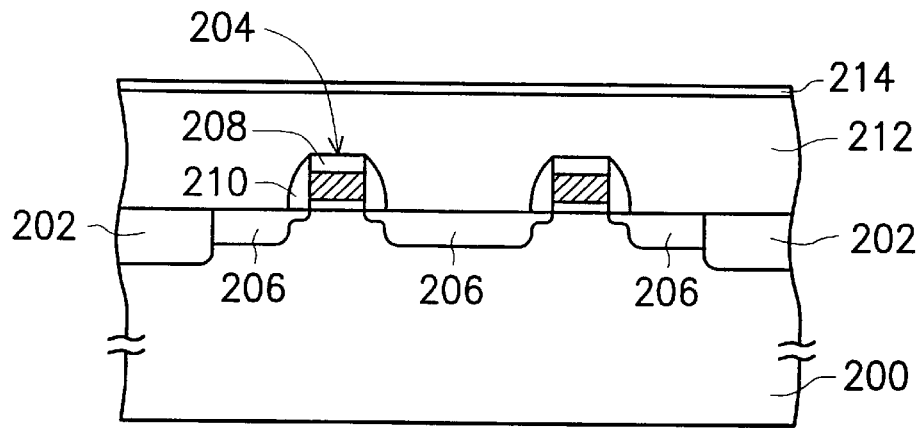
FIGS. 2A through 2F are schematic, cross-sectional views of the process for manufacturing a bit line in a preferred embodiment according to the invention.

As shown in FIG. 2A, an isolation region 202 is formed in a substrate 200 to define the active region of the device. The method of forming the isolation region 202 can be local oxidation or a shallow trench isolation process, for example. A gate 204 and a source/drain region 206 of the FET are formed on the active region of the substrate 200. The gate 204 comprises a cap layer 208 at the top of the gate 204 and a spacer 210 on the sidewall of the gate 204. A dielectric layer 212 is formed over the substrate 200. An etching stop layer 214 is formed on the dielectric layer 212. The etching rates of the cap layer 208 and the spacer 210 are different from that of the dielectric layer 212. The cap layer 208 and the spacer 210 can be made of silicon nitride by chemical vapor deposition (CVD), for example. The dielectric layer 212 can be made of silicon oxide or borophosphosilicate glass (BPSG) by CVD, for example. The etching rate of the etching stop layer 214 is different from that of the dielectric layer 212. The preferred etching stop layer 214 is made of silicon nitride by CVD.

Figure 2B:
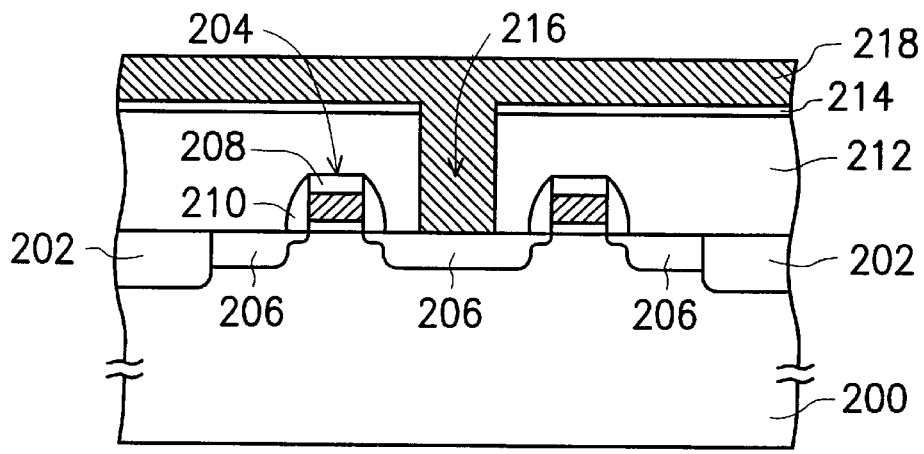

As shown in FIG. 2B, the etching stop layer 214 and the dielectric layer 212 are patterned to form a contact hole 216 exposing the source/drain region 206 by a typical photolithography and etching process. A conductive layer 218 is formed on the etching stop layer 214 and fills the contact hole 216. The conductive layer 218 is electrically coupled to the source/drain region 206. The conductive layer 218 can be a doped polysilicon layer formed by CVD, for example. In this example, the method of forming the doped polysilicon layer can be doping ions simultaneously with polysilicon layer deposition or performing an implantation step after the polysilicon layer is deposited.

Figure 2C:
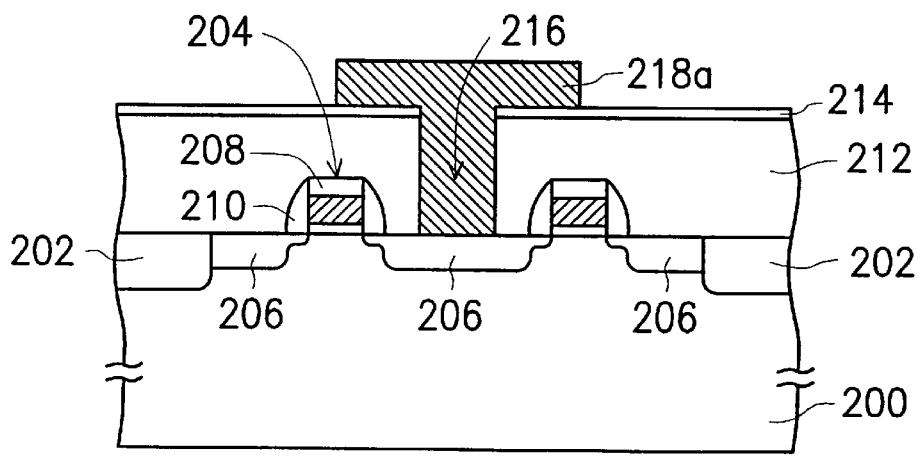

As shown in FIG. 2C, the conductive layer 218 is patterned to remove portions of the conductive layer 218 on the etching stop layer 214 and to expose portions of the etching stop layer 214. The remaining conductive layer 218 is denoted as 218a.

Figure 2D:
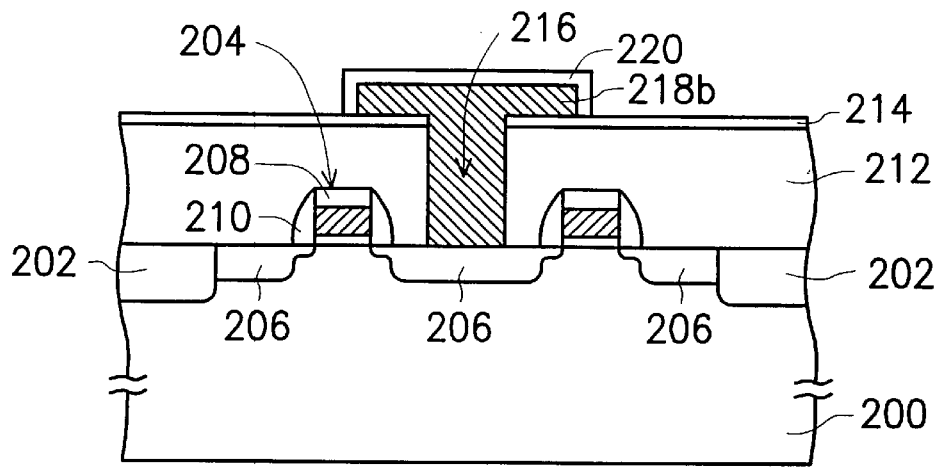

As shown in FIG. 2D, a thermal process is performed to convert the surface of the conductive layer 218a into an oxide layer 220. Therefore, the conductive layer 218a is transformed into a conductive layer 218b. The preferred thermal process is performed at a temperature of about 750–800° C. in a chamber filled with oxygen. The duration of the thermal process varies with the thickness of the oxide layer 220. The preferred thickness of the oxide layer 220 is about 300–500 angstroms.

Figure 2E:
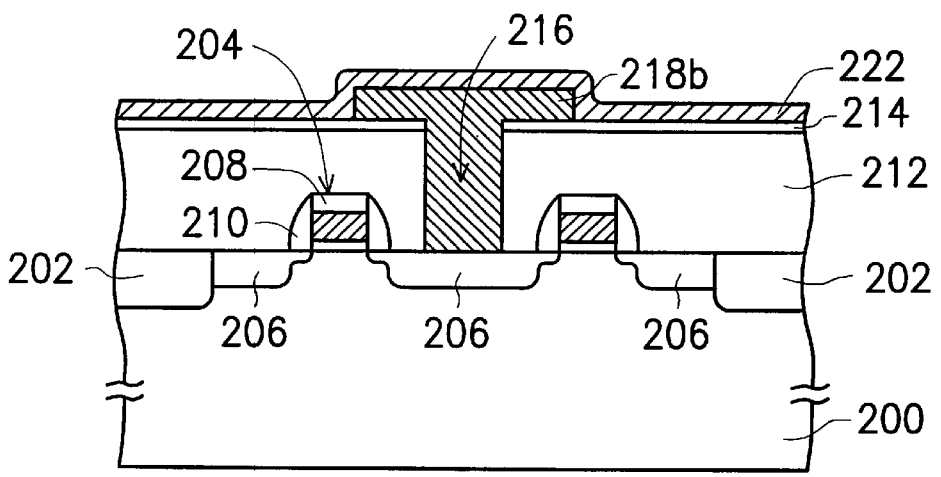

As shown in FIG. 2E, the oxide layer 220 is removed to expose the conductive layer 218b. In this example, the etching stop layer 214 is used as a stop point and the oxide layer is removed by wet etching. The preferred method of wet etching is to use hydrofluoric acid solution. Since the surface of the conductive layer 218a is oxidized to form the oxide layer 220 and the conductive layer 218b is transformed into the conductive layer 218b, the size of the conductive layer 218b is smaller than that of the conductive layer 218a. By performing the thermal process, the conductive layer 218 can be patterned by a typical line width process and the size of the patterned conductive layer 218 also can be reduced. Hence, the problem of alignment margin between the node contact hole and the bit line can be overcome. Furthermore, the problem of the conventional method, in which the decrement of the bit line width is limited by the resolution of the photolithography, can be solved.

Thereafter, as shown in FIG. 2E, a metal layer 222 is formed on the conductive layer 218b and the etching stop layer 214. Preferably, the conductive layer 222 can be made of refractory metal, for example. The refractory metal can be the metal used to perform a self-aligned silicide layer process (silicide) and the refractory metal includes titanium, tungsten, cobalt, nickel, platinum and palladium, for example. Since titanium is most broadly used, the material of the metal layer 222 is denoted as titanium. The method of forming the titanium layer can be magnetron direct current sputtering, for example.

Figure 2F:
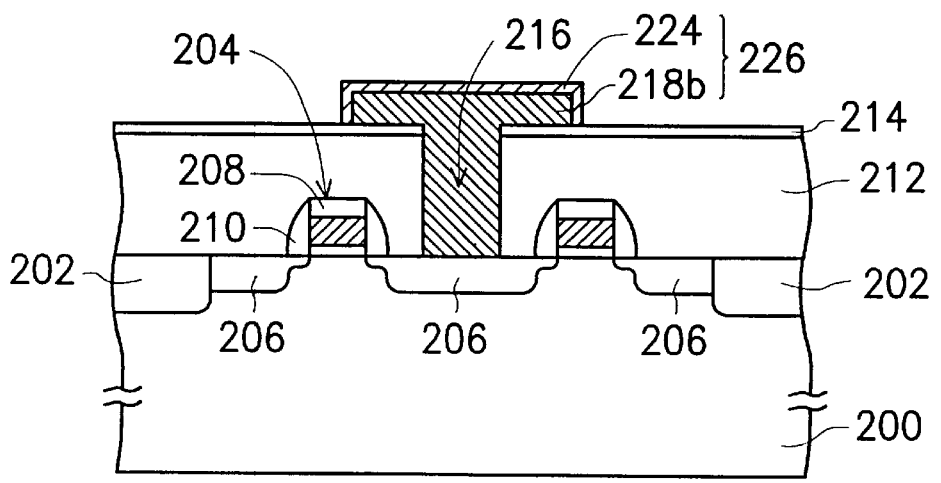

As shown in FIG. 2F, an annealing step is used to perform the silylation between the metal layer 222 and the conductive layer 218b, and then a silicide layer 224 is formed beneath the metal layer 222 and above the conductive layer 218b. The preferred annealing step can be rapid thermal annealing step, for example. The silicide layer 224 can be a titanium silicon layer or a cobalt silicon layer, for example. The portions of the metal layer 222 not engaging the silylation are stripped away to expose the silicide layer 224 on the conductive layer 218b by wet etching. The silicide layer 224 and the conductive layer 218b are composed to a bit line 226. In this example, when the metal layer 222 is made of titanium, it is heated rapidly to a temperature of about 700–750° C. to perform the annealing step. The portions of the titanium layer not engaging the silylation are stripped away to expose the titanium silicon layer by wet etching with a solution comprising hydrogen dioxide and ammonium.

In the invention, the resistance of the silicide layer 224 is much lower than that of the polysilicon typically used to form a bit line. Additionally, the silicide layer covers the conductive layer 218b and the silicide layer 224 is thinner than the oxide layer 220, so the bit line 226 is much smaller than the typical bit line. Hence, the size of the bit line formed by the method according to the invention is decreased and the resistance of the bit line is greatly reduced. Furthermore, the integration of the devices is greatly increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a bit line suitable for formation on a substrate having a dielectric layer thereon and a contact hole penetrating through the dielectric layer and exposing portions of the substrate, the method comprising the steps of:

forming a patterned conductive layer on the dielectric layer and filling the contact hole;

converting the surface of the patterned conductive layer into an oxide layer;

removing the oxide layer; and forming a silicide layer on the patterned conductive layer.

2. The method of claim 1, wherein the step of forming the oxide layer includes a thermal process.

3. The method of claim 2, wherein the temperature of the thermal process is about 750–800° C.

4. The method of claim 1, wherein the step of removing the oxide layer includes wet etching.

5. The method of claim 4, wherein the step of removing the oxide layer includes wet etching with hydrofluoric acid.

6. The method of claim 1, wherein the thickness of the silicide layer is thinner than that of the oxide layer.

7. The method of claim 1, wherein the silicide layer includes a titanium silicon layer.

8. The method of claim 1, wherein the silicide layer includes a cobalt silicon layer.

9. A method of manufacturing a bit line suitable for formation on a substrate having a dielectric layer thereon, an etching stop layer on the dielectric layer, and a contact hole penetrating through the etching stop layer and the dielectric layer, such that the contact hole exposes portions of the substrate, the method comprising the steps of:

forming a patterned polysilicon layer on the etching stop layer and filling the contact hole;

performing a thermal process to convert the surface of the patterned polysilicon layer into an oxide layer;

removing the oxide layer;

forming a metal layer on the patterned polysilicon layer;

performing an annealing step to convert a portion of the metal layer into a silicide layer; and removing the remaining portion of the metal layer.

10. The method of claim 9, wherein the step of forming the patterned polysilicon layer includes chemical vapor deposition.

11. The method of claim 9, wherein the temperature of the thermal process is about 750–800° C.

12. The method of claim 9, wherein the step of removing the oxide layer includes wet etching.

13. The method of claim 12, wherein the step of removing the oxide layer includes wet etching with hydrofluoric acid.

14. The method of claim 9, wherein the silicide layer is thinner than the oxide layer.

15. The method of claim 9, wherein material of the metal layer includes a refractory metal.

16. The method of claim 15, wherein the refractory metal includes titanium.

17. The method of claim 15, wherein the refractory metal includes cobalt.

18. The method of claim 9, wherein the silicide layer includes a titanium silicon layer.

19. The method of claim 9, wherein the silicide layer includes a cobalt silicon layer.

* * * * *